United States Patent [19]

Jacobs et al.

[11] Patent Number: 4,851,648
[45] Date of Patent: Jul. 25, 1989

[54] HEATER BAR ASSEMBLY

[75] Inventors: Joseph M. Jacobs, Redondo Beach; Robert F. Hubbard, Buena Park, both of Calif.

[73] Assignee: Hughes Aircraft Company, Los Angeles, Calif.

[21] Appl. No.: 261,215

[22] Filed: Oct. 24, 1988

[51] Int. Cl.$^4$ .............. B23K 1/02; B23K 1/04; B23K 11/16

[52] U.S. Cl. .................. 219/85.16; 219/56.1; 219/228; 219/243; 219/85.18; 228/44.7

[58] Field of Search ........... 219/85 D, 85 F, 56.1, 219/56.21, 228, 221, 233, 243; 228/44.7, 51, 55, 179, 180.2

[56] References Cited

U.S. PATENT DOCUMENTS 3,448,911 6/1969 Cushman ................ 228/44.7
4,568,819 2/1986 Stacconi ................ 219/227
4,654,507 3/1987 Hubbard et al. ........ 219/233

Primary Examiner—A. D. Pellinen
Assistant Examiner—David Osborn
Attorney, Agent, or Firm—Leonard A. Alkov; A. W. Karambelas

[57] ABSTRACT

U-shaped heater (42) carries busses (22, 24) which are electrically connected to supply heating power. Heated tip (58) is secured to the front of the heater and is as wide as is necessary to at the same time reach all of the leads to be soldered. The heater and busses rock on a pivot provided by pin (18) close to the heated tip so that rocking causes little lateral displacement. Rocking in the single plane is limited by the busses engaging on the back of body (12) and the thermocouple connector body engaging on the front of the body, both in sliding engagement. Spring (62) holds the movable parts on the pivot pin and centers the heater.

20 Claims, 2 Drawing Sheets

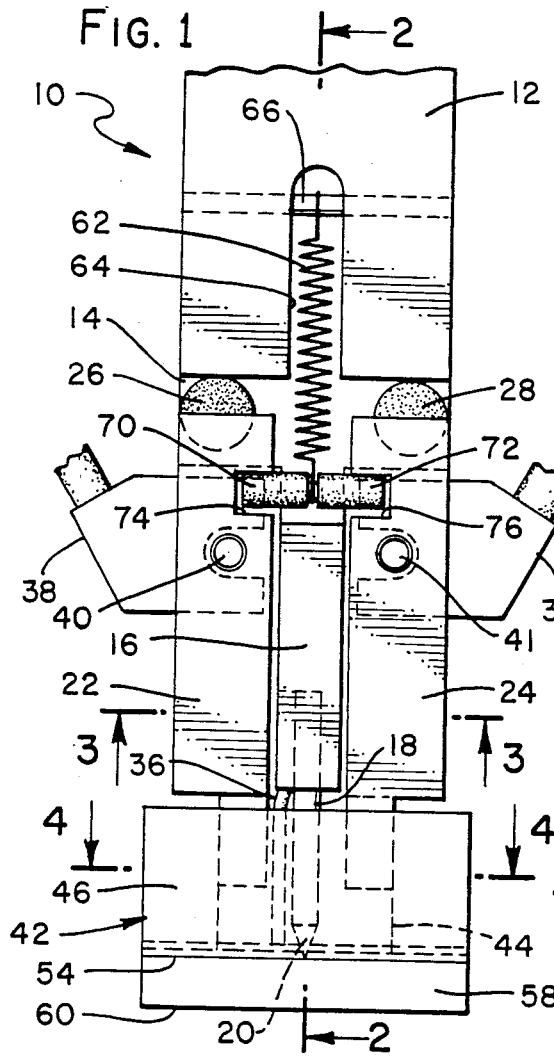
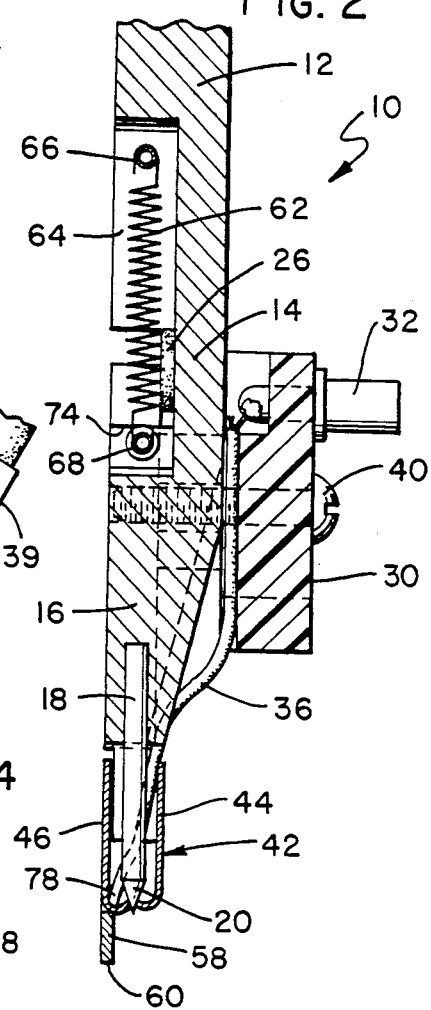
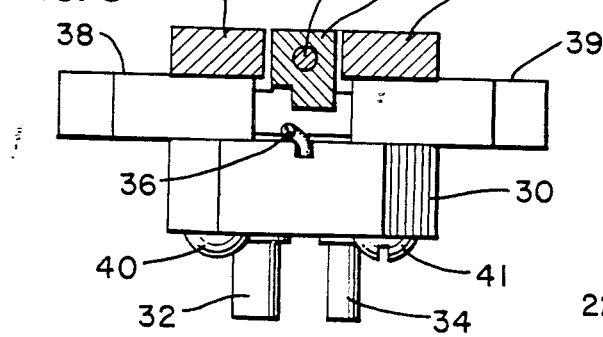
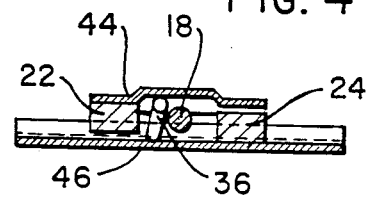

"A" DISPLACEMENT

"B" DISPLACEMENT

HEATER BAR ASSEMBLY

FIELD OF THE INVENTION

This invention is directed to a heater bar for soldering closely spaced components to printed wiring boards, and particularly apply heat to leads to melt solder already in place to cause reflow soldering.

BACKGROUND OF THE INVENTION

Printed wiring boards have pads thereon which are coated with solder. Electrical components are positioned so their electrical leads lie on the pads. The solder is heated to melting so that the leads are connected to the pads by means of a solder joint. There are a number of ways for heating the solder. One of the ways is to apply a heater bar to the lead, for heating the lead and solder. An example of this is Joseph M. Jacos and Robert F. Hubbard U.S. Pat. No. 4,654,507 entitled "Solder Reflow Heater Bar Assembly." The structure described in that patent is eminently successful.

The present trend in the technology where components are mounted on the surface of the printed wiring board is toward closer spacing between the components. As a result, it is difficult to gain access to the leads to apply heat to the leads in these closely spaced structures. In addition, the surface of the printed wiring board may not be absolutely level, and rocking of the heater bar assembly is necessary to accommodate for this out-of-level configuration. Rocking of the heater bar around a high pivot point causes lateral displacement of the leads. When the pads are smaller, due to attempts to increase the number of components in the printed wiring board, the lateral shifting due to rocking of the heater bar may move a lead off of its pad. Thus, a compact structure which minimizes lateral shifting upon rocking is required in order to meet the close spacing of components and small pads found on modern printed wiring boards.

SUMMARY OF THE INVENTION

In order to aid in the understanding of this invention, it can be stated in essentially summary form that it is directed to a heater bar assembly wherein the heater bar is U-shaped with the soldering surface close to the U and the pivot point close to the U to place the pivot point closely adjacent the soldering surface.

It is thus a purpose and advantage of this invention to provide a heater bar assembly which is able to reach and apply heat to leads on printed wiring board solder pads where the components are closely spaced.

It is another purpose and advantage of this invention to provide a pivot for the heater bar which is forward close to the soldering surface to cause less misalignment between the component leads and the printed wiring board pads.

It is another purpose and advantage to provide a heater bar assembly which has a small and restorable face so as to permit it to be dressed without removal of essential heater bar material.

Other purposes and advantages of this invention will become apparent from a study of the following portion of this specification, the claims and the attached drawings wherein:

BRIEF DESCRIPTION OF THE DRAWINGS

FIG. 1 is a rear elevational view of the heater bar assembly of this invention.

FIG. 2 is a substantially central section as seen generally along line 2—2 of FIG. 1.

FIG. 3 is an upwardly looking transverse section, as seen generally along line 3—3 of FIG. 1.

FIG. 4 is a downwardly looking transverse section, as seen generally along the line 4—4 of FIG. 1.

DESCRIPTION OF THE PREFERRED EMBODIMENT

Figure 5:
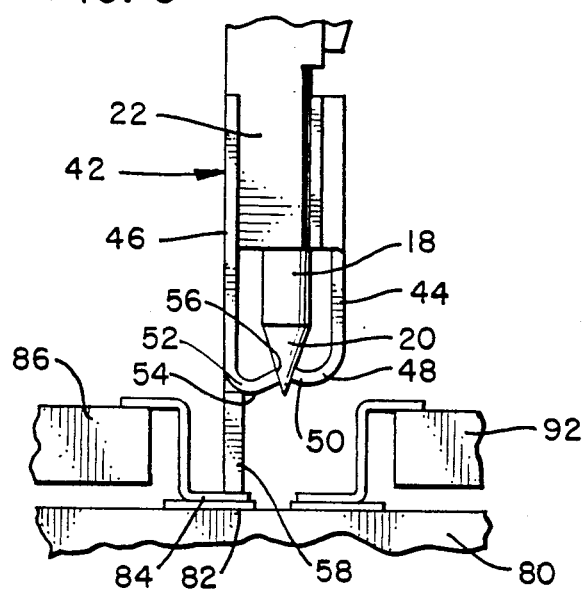
FIG. 5 is an enlarged side-elevational view of the heater bar, shown in relationship to component leads being heated.

The heater bar assembly of this invention is generally indicated at 10 in FIGS. 1 and 2. Body 12 is rectangular and preferably metallic and serves as the mounting structure for the heater bar assembly. Body 12 extends upward from the broken-away line in FIGS. 1 and 2 and has fastener means thereon for mounting upon the soldering machine. The soldering machine preferably automatically positions the heater bar assembly and brings it down in to soldering position. In addition, the soldering machine supplies the correct current for the correct time to provide sufficient heat for proper soldering. Body 12 extends downward from its mounting location and is slotted across to provide guide section 14. Below the guide section, the body is narrowed to define rectangular finger 16. Pressed into a drilled opening in the lower end of the finger is pivot pin 18. The lower end of pivot pin 18 carries pivot point 20 thereon, see FIGS. 2 and 5. This provides the rigid structure which defines the precise location of the pivot point with respect to the body 12 and thus with respect to the soldering machine.

FIG. 1 is a back view of the assembly, and in this orientation, it is seen that right and left busses 22 and 24 are positioned adjacent the sides of finger 18 and are spaced therefrom and extend downward therealong. The buss bars 22 and 24 extend upward to the back of the guide section 14 where they respectively lie on pads 26 and 28. Right pad 26 is also seen in FIG. 2 to show that the buss bars are spaced from the metallic guide section. The pads 26 and 28 are of insulative, low-friction material to electrically separate the buss bars from the guide section and to permit lateral sliding motion of the buss bars with respect to the guide section. Opposite the upper end of the buss bars is thermocouple connector body 30. Body 30 is made of dielectric material and carries thereon thermocouple connectors 32 and 34. Thermocouple leads 36 extend downward from the thermocouple connectors. Right and left lugs 38 and 39 are positioned between the thermocouple connector body and the two busses, respectively. Power leads from the right and left lugs are connected to the soldering machine, which supplies the heater current therethrough. Clamp screws 40 and 41 have their heads engaging on the front of the thermocouple connector body, extend through the thermocouple connector body, through lugs 38 and 39, and threadedly engage in the busses 22 and 24. The screw 40 is shown in FIG. 2 in dashed lines to illustrate this connection function. FIG. 1 illustrates that the lugs 38 and 39 are slotted so that they may be pulled out simply by loosening the clamp screws. When the clamp screws are tightened, the busses 22 and 24 on the back and the thermocouple connector body on the front are not clamped tight to the guide section 14, but lateral motion is provided. The fit is close so that rotation around the center line, as defined by the axis of pivot pin 18, is minimized.

Heater 42 is a U-shaped structure of metal of intermediate resistance so that, when electric current is passed therethrough, heating of the heater results. Heater 42 is U-shaped with a front leg 44 and a back leg 46. The front leg is attached to right buss 22 and is spaced from left buss 24. Similarly, the back leg 46 is connected to left buss 24 and is spaced from right buss 22, see FIG. 4. In this way, current passing through the busses passes through the heater, from one leg to the other. As is seen in FIG. 5, heater 42 has a first bend 48 of about 90 degrees which produces a platform 50 between the front and back legs of the heater. Beyond the platform, second bend 52 is of more than 90 degrees and carries the front 54 of the U-shaped heater past the platform 50. Pivot opening 56 in the platform receives pivot point 20. At the front of the heater, heated tip 58 is attached by any convenient means which is of high thermal conductivity and is strong at heater temperatures. Heated tip 58 has a soldering face 60 which applies the heat to the required location for soldering.

The movable structure comprised of heated tip 58, busses 22 and 24, lugs 38 and 39, thermocouple connector body 30 and the screws 40 and 41 which hold it together thus pivot around pivot opening 56 engaging upon pivot point 20. The small dimension of these parts is such that conical binding does not occur, although spherical surfaces could be employed if the structure was larger. The closeness of the busses and thermocouple connector body to the guide section 14 constrains the pivoting motion to a plane parallel to the paper in FIG. 1 with its axis normal to the plane of the paper in FIG. 1 with the axis passing through the engagement of the pivot pin in the pivot opening.

As thus far described, nothing retains the movable assembly upon the body 12. This retention is by tension spring 62, see FIGS. 1 and 2. The upper part of the tension spring lies in spring slot 64. Cross pin 66 lies in a cross pin opening through the body adjacent the top of slot 64 with the spring engaged upon the cross pin. The lower end of the spring is engaged upon cross pin 60, see FIG. 2. Dielectric insulating cups 70 and 72 lie on the ends of cross pin 68. These cups engage in slots 74 and 76, respectively, in busses 22 and 24. The tension of spring 64 not only holds up the movable structure, but also urges it toward the centered position illustrated in FIG. 1. Any rotation of the movable assembly stretches the spring. The thermocouple leads 36 extend down into heater 42 and terminate in a thermocouple 78 within the U of the heater, directly above the heated tip 58. In this way, heater temperature is signaled.

The heated tip 58 is thin enough and long enough to reach between components, as shown in FIG. 5, and is as wide as is necessary to reach across the desired number of leads and pads. An additional advantage of having this extended heated tip is that the face 60 can be dressed should it become other than flat along the face. Repeated dressings of the face to make it planar in a direction parallel to its rotational axis B give long life to the heater. Such dressing does not wear away the current-carrying U-portion of the heater, but merely reduces the height of heated tip 58. Thus, many dressings can be obtained without reducing the utility of the heater.

Figure 7:
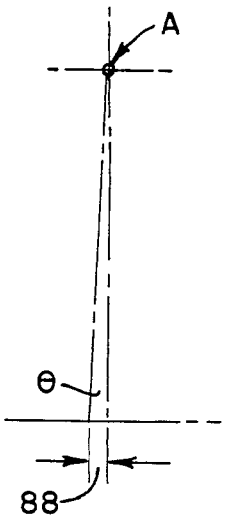
FIG. 7 illustrates the lateral displacement caused by rocking motion about a high pivot as a result of out-of-level pads.
Figure 6:
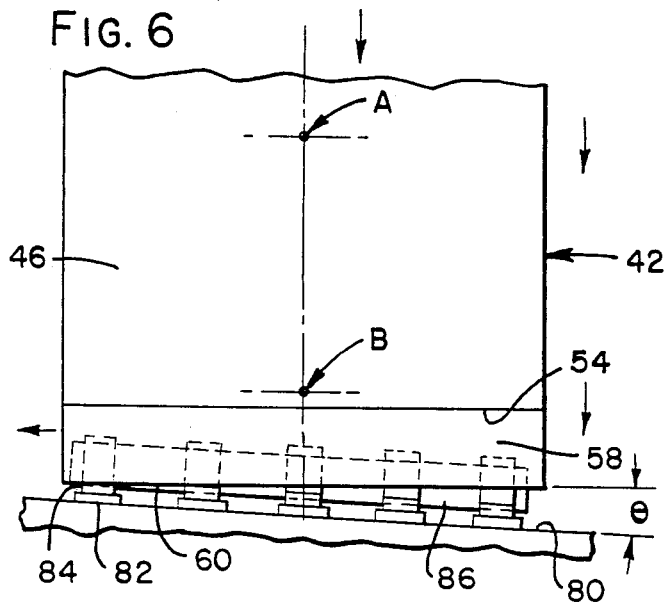
FIG. 6 is a front-elevational view of the heater bar showing it coming into contact with leads which are on an out-of-level group of pads.
Figure 8:
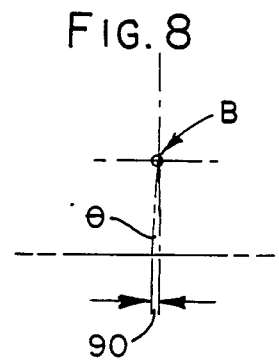
FIG. 8 is a diagram showing the amount of displacement due to rocking motion around a low pivot as a result of out-of-level pads.
Figure 9:
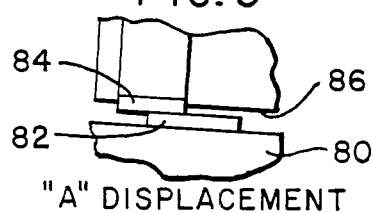
FIG. 9 shows the lead-to-pad displacement as a result of the rotation illustrated in FIG. 7.

FIGS. 6, 7, 8, 9 and 10 illustrate the significance of having a pivot point close to the soldering point at the face of the heated tip. FIG. 6 illustrates the heater 42 moving downward so that the face 60 of the heated tip 58 engages on a plurality of component leads on contacts on a printed wiring board 80. One of the pads on the printed wiring board is indicated at 82, and the component lead 84 is shown in association with that pad. In FIG. 6, it is seen that component 86 has five such component leads in association with a corresponding number of pads. The component 86 may be a flat pack with the leads forming a lead frame therefrom. In the case where the surface and pads of the printed wiring board are not absolutely level, the heater 42 must pivot so that its face 60 contacts all of the leads. The angle Theta at the lower right of FIG. 6 illustrates this lack of level condition of that portion of the printed wiring board. Such may occur from board warping. If the pivot point of the heater 42 is high, for example at point A, far away from the face 60, then the rotation about the angle Theta produces a large displacement 88, as seen in FIG. 7. FIG. 7 is on the same scale as FIG. 6, and FIG. 9 is on an enlarged scale to illustrate how this displacement moves the component lead 84 at least partially off of the pad 82. This results in unsatisfactory solder conditions so that reliable soldering is difficult to achieve.

Figure 10:
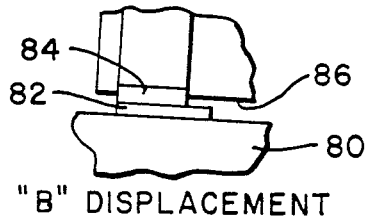
FIG. 10 illustrates the lead-to-place displacement as a result of the rotation illustrated in FIG. 8.

When the pivot point is low close to the face 60, for example at point B substantially at the lower second bend 54, the same rotation causes lesser displacement. When the heater 42 comes and pivots at point B in FIG. 6, the same scale displacement 90 is illustrated in FIG. 8. On an enlarged scale, as seen in FIG. 10, this displacement 90 does not offset the lead from its pad. Thus, reliable soldering can be achieved. Actual angles are quite small, but alignment of leads to pads is very critical, and even small displacement reduces reliability. Acceptable soldering joints for all of the leads of a multi-leaded component to their corresponding soldering pads on a printed wiring board cannot be achieved unless equal force is applied to all the leads of the component. The limited rocking of the heater and its face 60 provide this equal force, and the low pivot minimizes the offset which occurs. Since the spring 62 centers the movable structure, including the heated tip 58, the face 60 starts level and rotates only to provide equal force on all of the leads. Thus, translational forces are not produced when the board is level. The rocking limit of the moving structure is the striking of one or the other buss bars against the center finger 16, as seen in FIG. 1. However, this is a mechanical limit which prevents damage to the heater bar assembly and is not reached during normal soldering operation.

FIG. 5 illustrates how two closely adjacent components 86 and 92 can have their leads reached by the heater bar assembly of this invention due to the narrow front-to-back dimension and due to the fact that heated tip 58 is thin and extends down from the U-shaped heater to keep the U-shape of the heater above and away from the component. In this way, reliable soldering is achieved.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A heater bar assembly comprising:
   a body, said body being for mounting at its upper end for carrying thereon a heater at its lower end;
   a pivot point on said body adjacent its lower end;
   a U-shaped heater having legs, a pivot point in said heater between said legs, said pivot point on said body engaging said pivot point on said heater so that said heater can rotate on said pivot points with respect to said body;
   guide means on said heater bar for limiting motion of said heater with respect to said body to rotation on a single plane; and
   a soldering face on said heater, said soldering face lying substantially in said rotational plane so that as said heater is brought to a surface, said soldering surface can rotate to engage across said surface.

2. The heater bar assembly of claim 1 wherein said heating face is on a heated tip attached to said U-shaped heater.

3. The heater bar assembly of claim 1 wherein said means for constraining said heater bar to a single plane comprises a guide surface on said body and guide means on said heater bar engaging with said guide surface for constraining rotation of said heater bar about said pivot.

4. The heater bar assembly of claim 3 wherein there are first and second busses respectively secured to said legs of said U-shaped heater to supply current to said heater, said busses lying against said guide surface to constrain rotation of said heater with respect to said body.

5. The heater bar assembly of claim 4 wherein said guide surface includes dielectric insulation and said guide surface guiding said busses is a back guide surface and there is also a front guide surface substantially parallel to said back guide surface and there is guide means attached to said heater bar for engaging said front guide surface for limiting said heater to rotation in a plane.

6. The heater bar assembly of claim 5 wherein said means engaging said front guide surface is a thermocouple connector body which is secured to said busses and spaced therefrom to receive said guide surfaces therebetween.

7. The heater bar assembly of claim 6 wherein said heating face is on a heated tip attached to said U-shaped heater.

8. A heater bar assembly comprising:
   a body, a pivot point on said body and guide means on said body;
   a heater, a soldering face on said heater, a pivot point on said heater adjacent said soldering face and guide means on said heater for cooperating with said guide means on said body for limiting rotation of said soldering face with respect to said body to a single plane, said soldering face lying substantially parallel to said plane.

9. The heater bar assembly of claim 8 wherein said heater is a U-shaped heater formed by front and back legs and said pivot point is between said legs.

10. The heater bar assembly of claim 9 wherein a heated tip is secured to said U-shaped heater bar, said soldering face being on said heated tip.

11. The heater bar assembly of claim 10 wherein said guide means comprises front and back guide surfaces on said body and means is secured to said heater bar for engaging said guide surface to limit rotation of said heater bar with respect to said body to rotation in a single plane parallel to said guide surfaces.

12. The heater bar assembly of claim 11 wherein said means engaging said front and back guide surfaces comprises a thermocouple connector body and a buss bar, respectively, said thermocouple connector body and said buss bar being secured together and spaced from each other so as to engage said front and back guide surfaces.

13. The heater bar assembly of claim 12 wherein a spring is engaged between said heater and said body to resiliently retain said heater in place and center said heater in its rotation.

14. The heater bar assembly of claim 13 wherein there are first and second busses connected to said heater and said spring is connected to a pin engaging with said first and second busses to urge said heater onto said pivot.

15. A heater bar assembly comprising:
    a wide, thin and long heated tip having a face thereon for engagement on component leads to solder the component leads;
    heating means for heating said heated tip to solder temperature;
    support means for pivotally supporting said heated tip so that it is constrained to be free to rotate only in a plane which is substantially parallel to said long thin heated tip and the axis of rotation is close to said face of said heated tip so as to permit soldering of component leads to printed wiring board pads between closely spaced components.

16. The heater bar assembly of claim 15 wherein said heated tip extends from said heating means for permitting refacing of said face for reuse of said heated tip.

17. The heater bar assembly of claim 16 further including a spring to resiliently retain said face in a central orientation before contact with said face causes rotation of said tip on its pivot in said plane.

18. The heater bar assembly of claim 17 wherein said heating means comprises a heater and said pivot means comprises a pin engaging in said heater and said heated tip is directly attached to said heater.

19. The heater bar assembly of claim 18 wherein said heater bar assembly includes a body for attachment to a soldering machine and said pivot of said heater bar is on said body.

20. The heater bar assembly of claim 19 wherein said heater is U-shaped having front and back legs and a bend between said legs and said pivot point is at said bend.

* * * * *